United States Patent [19]

Scholtens

[11] Patent Number: 4,478,690
[45] Date of Patent: Oct. 23, 1984

[54] METHOD OF PARTIALLY METALLIZING ELECTRICALLY CONDUCTIVE NON-METALLIC PATTERNS

[75] Inventor: Eltjo Scholtens, Eindhoven, Netherlands

[73] Assignee: U.S. Philips Corporation, New York, N.Y.

[21] Appl. No.: 452,570

[22] Filed: Dec. 23, 1982

[30] Foreign Application Priority Data

Dec. 31, 1981 [NL] Netherlands ............. 8105922

[51] Int. Cl.³ ............................................. C23C 3/02
[52] U.S. Cl. ............................... 204/15; 204/38 S;
427/12; 427/108; 427/98; 427/123; 427/443.1
[58] Field of Search ............... 427/12, 108, 98, 123, 427/443.1; 204/15, 38 S

[56] References Cited

U.S. PATENT DOCUMENTS 4,264,646  4/1981  Thornburg et al. ............ 427/108 X Primary Examiner—Norman Morgenstern
Assistant Examiner—Richard Bueker
Attorney, Agent, or Firm—Paul R. Miller

[57] ABSTRACT

The partial metallization of electrically conductive non-metallic patterns, for example transparent patterns of indium oxide and/or tin oxide or resistance layers of cermet material, on insulating carriers by means of an electroless plating solution. The plating is initiated by applying a potential difference for a short period of time between the patterns and an auxiliary electrode.

4 Claims, 1 Drawing Figure

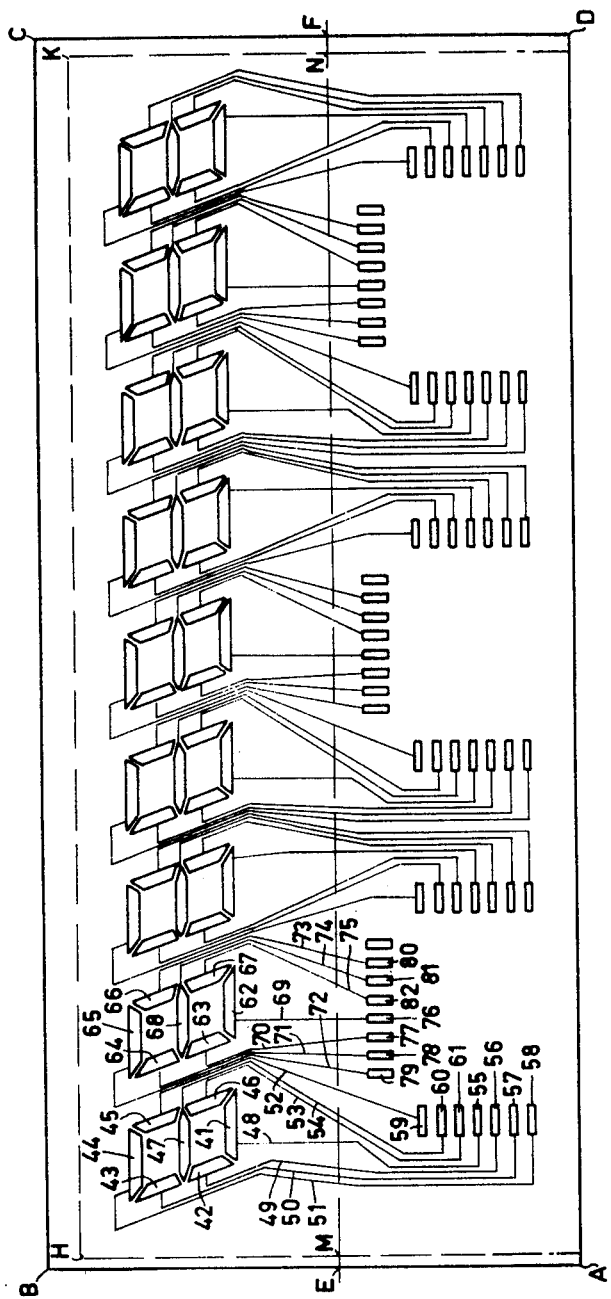

METHOD OF PARTIALLY METALLIZING ELECTRICALLY CONDUCTIVE NON-METALLIC PATTERNS

The invention relates to a method of partially metallising electrically conductive non-metallic patterns on insulating substrates and to a product thus obtained.

From GB Patent Specification No. 1,435,319 such a method is known for the manufacture of a device consisting of a transparent insulating substrate, on which a pattern of transparent conductors is provided on a part of which a layer is present which consists of a metal with which a bond can be made by means of soldering, welding, thermocompression and other techniques.

In this method a metal auxiliary layer is used which has one or more recesses in the form of the conductor pattern to be made. A transparent, metaloxidic, conductive layer is provided on the metal auxiliary layer and in the recesses in contact with the substrate and a part of the transparent conductive layer is then provided with a layer of a metal with which a bond can be made. The parts of the transparent conductive layer on the metal auxiliary layer together with parts of the metal layer, with which a bond can be made, on the parts of the transparent conductive layer are removed by selectively dissolving the auxiliary layer, so that a conductor pattern remains which partly consists of a transparent layer and for the remaining part consists of at least two layers, the innermost of which consists of transparent conductive material and the outermost of which consists of metal with which a bond can be made.

The metal layers considered in this method are provided by vapour-deposition or by sputtering and the transparent metal oxidic layer is provided by hydrolysis and/or pyrolysis of a relevant metal compound at the surface or by sputtering.

In this method a mask is provided twice, for example by means of a photoresist, which is exposed via a negative and is then developed, after which either the exposed parts or the non-exposed parts, dependent on the type of photoresist, are removed. Auxiliary layers of other materials may also be used. The masks are used as a screening in vapour-deposition, electro-deposition or electroless metal plating or in etching away parts of a uniform metal layer.

When exposure is carried out several times, registration problems occur, while undercutting may take place during etching due to the presence of different materials. The current complexity of, and the presence of fine details in, the patterns in these techniques easily give rise to shortcircuit or interruption.

The invention provides a considerable simplification of this method and avoids the above-mentioned disadvantages.

It is characterized in that the part of the pattern to be metallised is immersed in an electroless plating solution and that a potential difference is applied for a short period of time between the pattern and the solution so as to initiate the metal deposition. A short period of time is a time in the order of 10 sec.

An embodiment which is very interesting within the scope of the invention is a liquid crystal panel with transparent electrodes. The metallisation is only partly necessary, that is to say only on the part on which the supply conductors for the display elements are present, and may then be initiated by keeping the part immersed and then applying a voltage pulse.

A reduction in potential of the part to be metallised relative to the solution may be carried out in various manners. One method is by using an external voltage source and an auxiliary electrode which extends in the solution. Another possibility is to externally short-circuit the pattern to be metallised with another object on which the metal deposition in question is already in progress and a potential has settled between the depositing metal and the solution.

The metal to be deposited is preferably nickel, the most favourable reduction agent being a borazane. In that case an Ni-B-deposition is obtained having a large specific conductivity which has a good solderability. A hypophosphite as a reduction agent is also possible.

In patterns manufactured by means of thick-film silk-screening techniques the method according to the invention is also possible, for example, for making low-ohmic connections on resistors or conductor tracks. In this case it is the so-called cermet materials which consist of dispersed metallic particles and/or metal oxidic particles in a vitreous matrix or also of amorphous carbon or graphite particles dispersed in a binder. In the resistor patterns the initiation of the metal deposition is produced exclusively by means of an external direct voltage source.

The invention will be described in greater detail with reference to the accompanying drawing and a few embodiments.

The FIGURE shows one of the sides of a liquid crystal display with the electrodes of transparent indium tin oxide on a pyrex glass plate. The display shows nine symbols each consisting of seven segments (41 to 47), from which the digits 1 to 9 and 0 can be composed. Each segment is connected to a soldering contact (55 to 61) by means of a narrow conductor track (48 to 54). All contacts and the conductor tracks in the area EFDA are coated with a metal layer in accordance with the method of the invention. For that purpose the required potential for the initiation is applied by connecting the conductors 48 to 54 within the area EFCB to the voltage source. After interrupting the contact the nucleated parts within the area EFDA are then electrolessly plated.

EXAMPLE 1

A glass substrate of $3\times3$ cm$^2$ which is covered with transparent layer of indium tin oxide having a resistance of 30Ω per square and etched into a pattern of 50 conductor tracks of $27\times0.5$ mm having a mutual spacing of 0.1 mm after treatment in an alkaline degreasing solution at room temperature is washed in cold deionised water and then dipped for 80% of the length of the conductor track in an electroless nickel-plating bath having a composition according to the prescription "NIPOSIT 468" of Shipley which contains demethylaminoborane as a reduction agent in addition to a nickel salt, at a temperature of 65° C.

When the tracks of the conductor pattern are conductively connected externally to a substrate which is placed in the same solution and on which the metal deposition is already taking place, the metal deposition starts after approximately 15 seconds visibly over the surface of the part of the tracks immersed in the liquid. After approximately 10 minutes each track is selectively provided with a readily adhering solderable metal layer having a uniform layer thickness of 1 μm.

EXAMPLE 2

The same conductor pattern as in Example 1 is placed in the same electroless nickel-plating solution but this time at room temperature. When a voltage difference of approximately 1 V is applied (cathodically) between the conductor tracks and an inert electrode (for example Pt) also placed in the same solution, by means of an external voltage source for 5 seconds, then it is found that as a result of this the tracks, although not yet visible, are provided with sufficient catalytic nuclei.

Immediately after transferring the substrate into a solution of the same composition as in Example 1, at 65° C., selective electroless deposition of the nucleated tracks starts over the full length of the tracks. Of course the nucleation may also take place in the same solution and at the same temperature. In this example it is demonstrated that the voltage pulse provides only the catalytic nuclei and that the metallisation is entirely the result of selective electroless deposition.

EXAMPLE 3

The same nucleation method as described in Example 2 is now carried out in a dilute "NIPOSIT 468" nickel-plating solution. A dilution of 1:20 means that now a minimum voltage difference of 5.5 V for approximately 10 seconds is necessary to start the metallisation homogeneously after transferring the nucleated substrate to the undiluted nickel-plating solution of 65° C. Increasing the applied voltage and at the same time decreasing the concentration during nucleation proves to be of particular advantage for conductors having a resistance value higher than 30Ω/square.

EXAMPLE 4

The substrate to be metallised is a ceramic plate and has a resistive pattern provided by silk screening on a glass having herein conductive particles of ruthenium oxide from a paste prepared by Messrs. E. I. Dupont de Nemours under number 1331 having a resistance of 1 kΩ/square.

The contact places of the pattern having an area of $1.7 \times 2.5$ mm$^2$ are connected to paths 0.25 mm wide.

After degreasing as described in Example 1 in an alkaline solution and rinsing in deionised water, the contact places of $1.7 \times 2.5$ mm$^2$ are dipped in the undiluted metallisation solution of the same composition as mentioned above ("NIPOSIT 468").

An external direct voltage source is now connected between the resistance tracks of 0.25 mm present above the solution and an inert auxiliary electrode, for example Pt, placed in the same solution. When the contact places are now switched cathodically for 10 seconds via the resistance tracks with respect to the auxiliary electrode at an applied voltage of 15 V, the surface as a result of this has become sufficiently catalytic to selectively grow a metal layer of uniform thickness after transferring to the same solution of 65° C.

Apparently, effective metallisation takes place only in the electroless period since no resistance reduction directly after the voltage pulse could be measured and the resistance of the contact surface decreases continuously with time during the stay in the nickel-plating solution of 65° C.

What is claimed is:

1. A method of partially metallising electrically conductive non-metallic patterns on insulating substrates, characterized in that the part of the pattern to be metallised is immersed in an electroless plating solution and a potential difference is applied for a short period of time between the pattern and the solution so as to initiate the metal deposition.

2. A method as claimed in claim 1 of partially metallising transparent patterns of indium oxide and/or tin oxide on a glass substrate.

3. A method as claimed in claim 1 of partially metallising resistance on conductor material consisting of metal oxide and/or finely divided metal in a vitreous matrix, or also of amorphous carbon particles or graphite particles dispersed in a binder.

4. A method as claimed in claim 1, in which said potential difference is applied for 10 seconds.

* * * * *